(12) United States Patent
Marin et al.

(10) Patent No.: US 10,923,443 B2
(45) Date of Patent: Feb. 16, 2021

(54) ELECTRONIC DEVICE PACKAGE INCLUDING A CAPACITOR

(71) Applicant: Intel Corporation, Santa Clara, CA (US)

(72) Inventors: Brandon C Marin, Chandler, AZ (US); Shivasubramanian Balasubramanian, Gilbert, AZ (US); Rahul Jain, Gilbert, AZ (US); Praneeth Akkinepally, Chandler, AZ (US); Jeremy D Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/369,708

(22) Filed: Mar. 29, 2019

(65) Prior Publication Data
US 2020/0312793 A1     Oct. 1, 2020

(51) Int. Cl.
  *H01L 23/495* (2006.01)
  *H01L 23/64* (2006.01)
  *H01L 23/498* (2006.01)
  *H01L 49/02* (2006.01)
  *H01L 21/48* (2006.01)

(52) U.S. Cl.
  CPC ........ *H01L 23/642* (2013.01); *H01L 21/4857* (2013.01); *H01L 23/49822* (2013.01); *H01L 23/49827* (2013.01); *H01L 28/40* (2013.01)

(58) Field of Classification Search
  CPC ........... H01L 23/542; H01L 23/649827; H01L 23/49822; H01L 21/4857
  See application file for complete search history.

(56) References Cited

U.S. PATENT DOCUMENTS

| 8,446,707 | B1 * | 5/2013 | Das | H01G 4/33 |
| | | | | 361/303 |
| 2005/0230779 | A1 * | 10/2005 | Ito | H01L 28/57 |
| | | | | 257/499 |

(Continued)

OTHER PUBLICATIONS

Arbatti, M, et al., "Ceramic Polymer Composites with High Dielectric Constant", Adv. Mater., vol. 19, No. 10, (2007), 1369-1372.

(Continued)

*Primary Examiner* — Phuc T Dang
(74) *Attorney, Agent, or Firm* — Schwegman Lundberg & Woessner, P.A.

(57) ABSTRACT

A substrate for an electronic device may include a first layer, a second layer, and may include a third layer. The first layer may include a capacitive material, and the capacitive material may be segmented into a first section, and a second section. Each of the first section and the second section may include a first surface and a second surface. The second layer may include a first conductor. The third layer may include a second conductor. The first surface of the second section of capacitive material may be directly coupled to the first conductor. The second surface of the second section of the capacitive material may be directly coupled to the second conductor. A first filler region may include a dielectric material and the first filler region may be located in a first gap between the first section of capacitive material and the second section of capacitive material.

25 Claims, 12 Drawing Sheets

(56) References Cited

U.S. PATENT DOCUMENTS

2008/0102565 A1* 5/2008 Zeng .................. H05K 1/0234
438/122
2008/0137263 A1* 6/2008 Min ...................... H05K 1/162
361/311

OTHER PUBLICATIONS

Bhattacharya, S K, et al., "Next generation integral passives: Materials, processes, and integration of resistors and capacitors on PWB substrates", J. Mater. Sci. Mater. Electron.,vol. 11, No. 3, (2000), 253-268.
Dang, Z M, et al., "Dielectric behavior of three-phase percolative Ni-BaTiO3/polyvinylidene fluoride composites", Appl. Phys. Lett., vol. 81, No. 25, (2001), 1541-1544.
Huang, C, et al., "Fully functionalized high-dielectric-constant nanophase polymers with high electromechanical response", Adv. Mater., vol. 17, No. 9, (2005), 1153-1158.
Jillek, W, et al., "Embedded components in printed circuit boards: A processing", Int. J. Adv. Manuf. Technol., vol. 25, No. 3-4, (2005), 350-360.
Pecharroman, F, et al., "New Percolative BaTiO 3 ± Ni Composites with a", Adv. Mater., vol. 13, No. 20, (2001), 1541-1544.
Yuan, J K, et al., "Giant dielectric permittivity nanocomposites: Realizing true potential of pristine carbon nanotubes in polyvinylidene fluoride matrix through an enhanced interfacial interaction", J. Phys. Chem. C, vol. 115, No. 13, (2011), 5515-5521.

* cited by examiner

ELECTRONIC DEVICE PACKAGE INCLUDING A CAPACITOR

TECHNICAL FIELD

This document pertains generally, but not by way of limitation, to a package for an electronic device, for instance an electronic device including a semiconductor die.

BACKGROUND

A package for an electronic device may include a substrate, and one or more electrical traces. The electrical traces may transmit electrical signals within the package. A capacitor (e.g., passive electrical component) may be coupled to an exterior surface of the package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
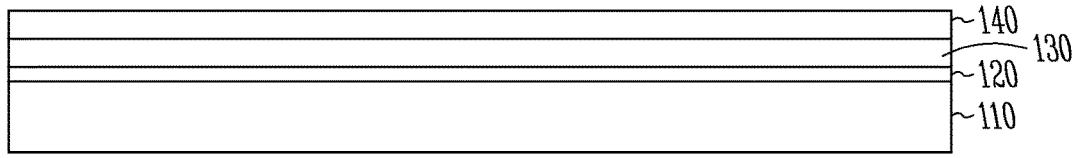
FIG. 1 shows a portion of one example of a first substrate during a manufacturing operation.

The present inventors have recognized, among other things, that a problem to be solved may include manufacturing a package (e.g., a substrate configured to couple with a semiconductor die) that includes a capacitor. Additionally, the present inventors have recognized, among other things, that a problem to be solved may include manufacturing a package that includes a capacitor embedded within (e.g., surrounded by, contained within, enclosed within, coupled to, or the like) layers of the package. Further, the present inventors have recognized, among other things, that a problem to be solved may include manufacturing a capacitor while manufacturing layers of the package.

The present subject matter may help provide a solution to these problems, such as by providing a substrate for an electronic device. The substrate may include a first layer, a second layer, and may include a third layer. The first layer may include a capacitive material, and the capacitive material may be segmented into a first section, and a second section. Each of the first section and the second section may include a first surface and a second surface. The second layer may include a first conductor. The third layer may include a second conductor. The first surface of the second section of capacitive material may be directly coupled to the first conductor. The second surface of the second section of the capacitive material may be directly coupled to the second conductor. A first filler region may include a dielectric material and the first filler region may be located in a first gap between the first section of capacitive material and the second section of capacitive material.

The substrate may be a part of the package, and the substrate may be configured to transmit electrical signals. For example, a semiconductor die may be coupled to the substrate, and the substrate may transmit electrical signals to (or from) the semiconductor die. An electrical charge may be stored in the capacitor (e.g., on the first conductor), and the charge may be discharged (e.g., current may flow to or from the first conductor or the second conductor).

The capacitive material may be coupled to the substrate during manufacture of the substrate. For example, the substrate may be built up layer by layer (e.g., in a semi-additive process). The capacitive material may be coupled to the substrate (e.g., the first conductor and the second conductor), and additional layers (e.g., a dielectric layer) may be coupled to the substrate. Accordingly, the capacitive material, the first conductor, and the second conductor may be embedded within the substrate, for example to provide a capacitor. Embedding the capacitor within the substrate may improve the performance of the electronic device, for example by reducing signal loss or noise that occurs during transmission of an electrical signal to (or from) the capacitor. Additionally, embedding the capacitor within the substrate may increase the density of capacitors coupled to the substrate. For example, a first capacitor that is embedded within the substrate may occupy less volume than a second capacitor that is mounted to an exterior surface of the substrate. Accordingly, embedding a plurality of capacitors within the substrate (in contrast to a plurality of capacitors that are coupled to an exterior surface of the substrate) may increase the density of capacitors coupled to the substrate. Further, embedding a capacitor within the substrate may reduce the cost of the package (in comparison to coupling capacitors to an exterior surface of the substrate).

This overview is intended to provide an overview of subject matter of the present patent application. This overview is not intended to provide an exclusive or exhaustive explanation of the invention. The detailed description continues and provides further information about the present patent application.

FIG. 1 shows a portion of one example of a substrate 100 during a manufacturing operation. A carrier 110 may be used during one or more manufacturing operations for the substrate 100. The carrier 110 may include (but is not limited to) glass (e.g., silicon dioxide or the like), silicon, a ceramic material (e.g., granite or the like). An adhesive layer 120 (e.g., tape, epoxy, glue, or the like) may selectively couple a first conductive layer 130 (e.g., a layer of nickel, tungsten, chrome, copper, aluminum, gold, or the like) to the carrier 110. The conductive layer 130 may be included in the substrate 100.

A layer of capacitive material 140 may be directly coupled to the first conductive layer 130. For example, the capacitive material 140 may be formed by a sintering operation, or may be compressed and heated, and the capacitive material 140 may be coupled to the first conductive layer 130. For example, the capacitive material 140 may be deposited on the first conductive layer 130, for instance with a physical vapor deposition operation, an electrolytic operation, an electroless operation, or the like. The capacitive material 140 may include (but is not limited to) calcium titanate, carbon nanotubes, polyvinylidene fluoride, polyvinylidene difluoride, phthalocyanine, nickel-barium titanate, barium titanate, or combinations thereof. Accordingly, the capacitive material 140 may have a real permittivity within a range of approximately 300 to 80,000 (e.g., 300 to 500, 500 to 1500, 1200 to 10,000, 300 to 25,000, or the like).

Figure 2:
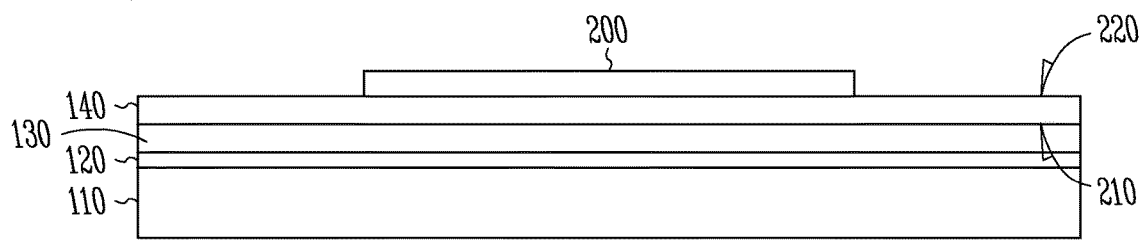
FIG. 2 shows the substrate of FIG. 1 during a manufacturing operation.

FIG. 2 shows the substrate 100 of FIG. 1 during a manufacturing operation. The substrate 100 may include a second conductive layer 200, and the layer 200 may be coupled to the capacitive material 140 (e.g., the second conductive layer 200 may be plated onto the capacitive material 140). Accordingly, the capacitive material 140 may be located (e.g., sandwiched, positioned, or the like) between the first conductive layer 130 and the second conductive layer 200. For instance, the first conductive layer 130 may be directly coupled to a first surface 210 of the capacitive material 140, and the second conductive layer 130 may be directly coupled to a second surface 220 of the capacitive material 140.

The second conductive layer 200 may include (copper, nickel, gold, aluminum, or the like). The second conductive layer 200 (e.g., a layer of copper) may include a different material than the first conductive layer 130 (e.g., a layer of nickel). The second conductive layer 200 may have a reduced dimension (e.g., a reduced width, a reduced area, or the like) in comparison to the first conductive layer 130.

Figure 3:
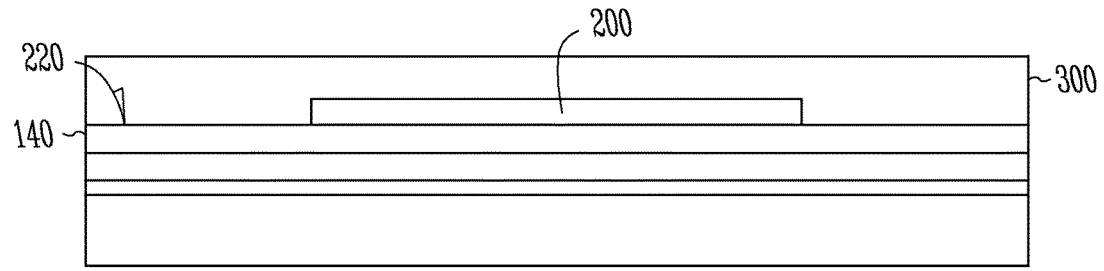
FIG. 3 shows the substrate of FIG. 1 during a manufacturing operation.

FIG. 3 shows the substrate 100 of FIG. 1 during a manufacturing operation. The substrate 100 may include a dielectric material 300, and the dielectric material 300 may be coupled to the second conductive layer 200. The dielectric material 300 may be coupled to the capacitive material 140, for instance the dielectric material 300 may be directly coupled to the second surface 220 of the capacitive material 140. The dielectric material 300 may enclose (e.g., surround, encapsulate, surround) the second conductive layer 200, and the second conductive layer 200 may be embedded within the dielectric material 300. The dielectric material 300 may include a polymeric material. For example, the dielectric material 140 may include (but is not limited to) oxirane epoxy, phenolate esters, phenolic esters, or a combination thereof. The dielectric material 300 may be less electrically conductive than the conductive layer 200.

Figure 4:
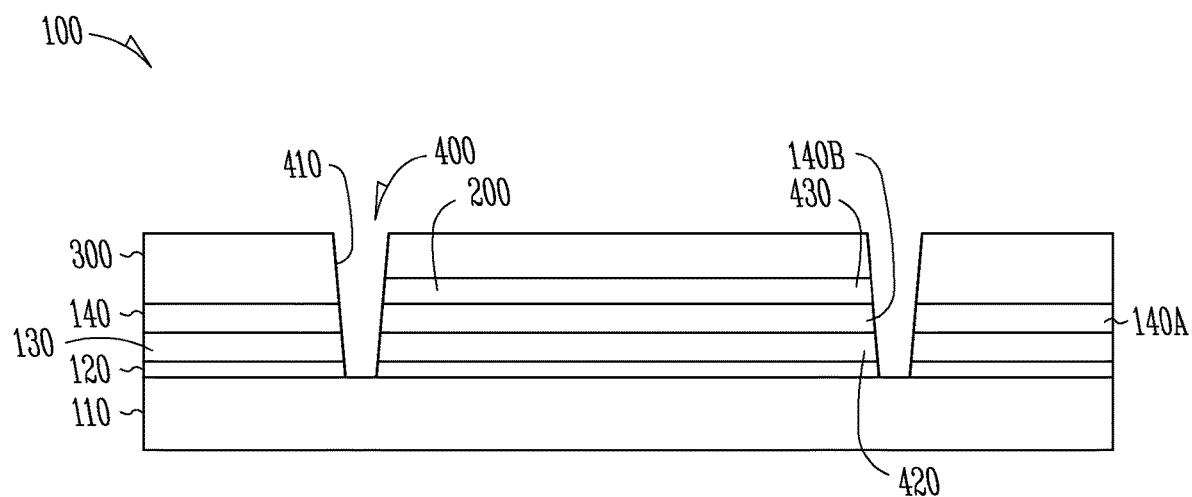
FIG. 4 shows the substrate of FIG. 1 during a manufacturing operation.

FIG. 4 shows the substrate 100 of FIG. 1 during a manufacturing operation. The substrate 100 may be subject to one or more material removal operations. For instance, the substrate 100 may be ablated (e.g., with a laser) to remove a portion of the substrate 100. A cavity 400 may be defined in (e.g., formed by laser ablation) the substrate 100. The cavity 400 may extend through the dielectric material 300, the second conductive layer 200, the capacitive material 140, the first conductive layer 130, and the adhesive layer 120. The cavity 400 may have a tapered profile (e.g., neck down, have a variable width, or the like). For instance, a width of the cavity 400 proximate to the dielectric material 300 may be greater than the width of the cavity 400 proximate to the first conductive layer 130. The cavity 400 may have the tapered profile as a result of a laser ablation operation. The wall 410 of the cavity 400 may be angled. Accordingly, the first conductor 420, the capacitive material 140, and the second conductor 430 may include a tapered profile.

Removing portions of the substrate 100 may segment (e.g., cut, divide, separate, or the like) the layer of capacitive material into a first section 140A and a second section 140B. The cavity 400 may be located between the sections 140A, 140B. The cavity 400 may space the section 140A apart from the section 140B. Removing portions of the substrate 100 may define a first conductor 420 and a second conductor 430. The first conductor 420 may include the first conductive layer 130, and the first conductor 420 may be coupled to the first surface 210 (shown in FIG. 2) of the capacitive layer 140 The first conductor 420 may be coupled to the second segment 140B. The second conductor 430 may include the second conductive layer 200, and the second conductor 430 may be coupled to the second surface 220 (shown in FIG. 2) of capacitive layer 140. The second conductor 430 may be coupled to the second segment 140B.

Figure 5:
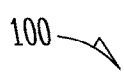
FIG. 5 shows a top view of the substrate of FIG. 4.

FIG. 5 shows a top view of the substrate 100 of FIG. 4. The cavity 400 may have a plurality of profiles, including the tapered profile described herein. FIG. 5 shows the cavity 400 having a rectangular profile (e.g., a perimeter of cavity 400 may be rectangular in shape). Additionally, the cavity 400 extends through the dielectric material 300, and exposes the carrier 110. The cavity 400 may have other profiles, including (but not limited to) a circular profile, a triangular profile, other geometric-shaped profiles, or an irregular profile.

Figure 6:
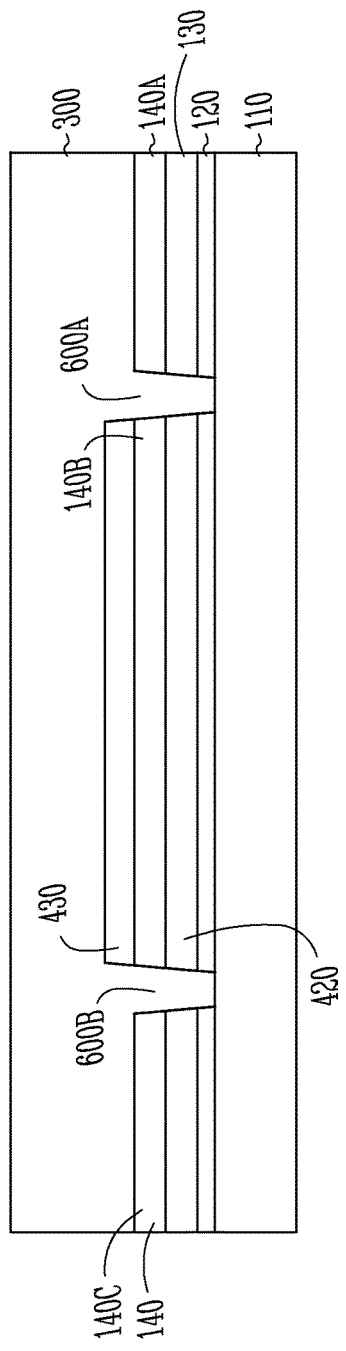
FIG. 6 shows the substrate of FIG. 1 during a manufacturing operation.

FIG. 6 shows the substrate 100 of FIG. 1 during a manufacturing operation. The substrate 100 may include a filler region, for example a first filler region 600A and a second filler region 600B. For instance, the dielectric material 300 may be located in (e.g., fill) the cavity 400 (shown in FIG. 4) and the dielectric material 300 may be coupled to the conductors 420, 430 and the second section 140B of the capacitive material 140.

The filler region 600A may be located between the first section 140A and the second section 140B of the capacitive material 140. The filler region 600B may be located between the second section 140B and the third section 140C of the capacitive material 140. The filler regions 600A, 600B may be coupled to the first conductive layer 130 and the adhesive 120. The filler regions 600A, 600B may surround the conductors 420, 430 and the second section 140B of the capacitive material 140. Accordingly, the conductors 420, 430 and the second section 140B of the capacitive material 140 may be embedded within the dielectric material 300. The filler regions 600A, 600B may extend beyond the first conductive layer 130. For example, the filler regions 600A, 600B may extend beyond the conductive layer 130 because portions of the adhesive layer 120 may be removed during formation of the cavity 400 (shown in FIG. 4). The dielectric material 300 may be located in the cavity 400, and the dielectric material 300 may be coplanar with a portion of the adhesive layer 120. Accordingly, filler regions 600A, 600B may extend beyond the first conductive layer 130. The filler regions 600A, 600B may have a tapered profile. The tapered profile of the filler regions 600A, 600B may correspond to the tapered profile of the cavity 400 (shown in FIG. 4).

Figure 7:
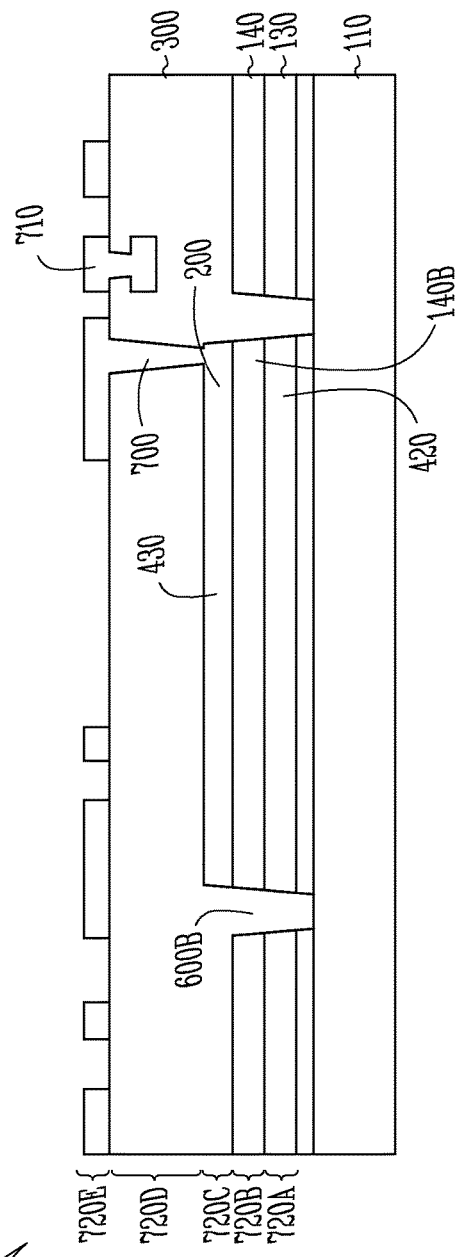
FIG. 7 shows the substrate of FIG. 1 during a manufacturing operation.

FIG. 7 shows the substrate 100 of FIG. 1 during a manufacturing operation. The substrate 100 may include a via 700. The via 700 may extend through the dielectric material 300, and the via 700 may be coupled with the second conductor 430. The substrate 710 may include electrical traces 710, and the electrical traces 710 may facilitate transmission of electrical signals within the substrate 100.

The substrate 100 may include a plurality of layers 720. For instance, the substrate 100 may include a first layer 720A that may include the first conductive layer 130 and the first conductor 420. A second layer 720B may include the capacitive material 140, for example the second section 140B of the capacitive material 140. A third layer 720C may include the second conductor 430. A fourth layer 720D may include the via 700. A fifth layer 720E may include the electrical traces 710. The layers 720 may include the dielectric material 300. The filler regions (e.g., the filler region 600B) may extend through the layers 720 (e.g., the layers 720A-720C).

Figure 8:
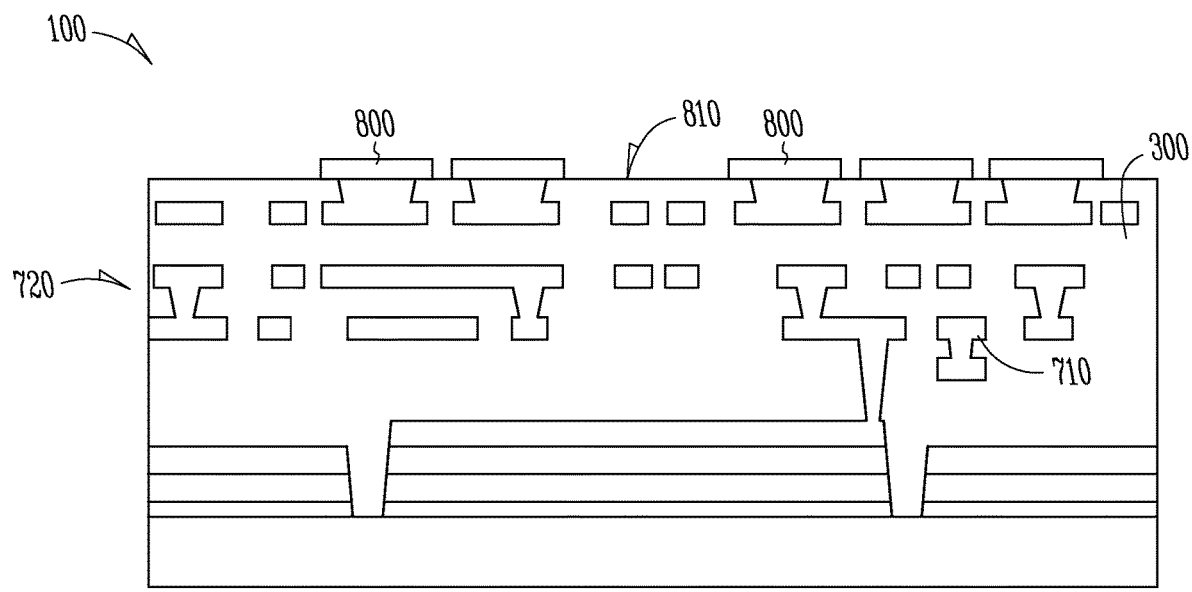
FIG. 8 shows the substrate of FIG. 1 during a manufacturing operation.

FIG. 8 shows the substrate 100 of FIG. 1 during a manufacturing operation. As described herein, the substrate 100 may include the plurality of layers 720. The substrate 100 may include the electrical traces 710 and additional components. For example, a first set of interconnects 800 may be coupled to a first surface 810 of the substrate 100. The interconnects 800 may facilitate coupling the substrate 100 with additional components. For example, the interconnects 800 may be coupled with a motherboard or a printed circuit board.

Figure 9:
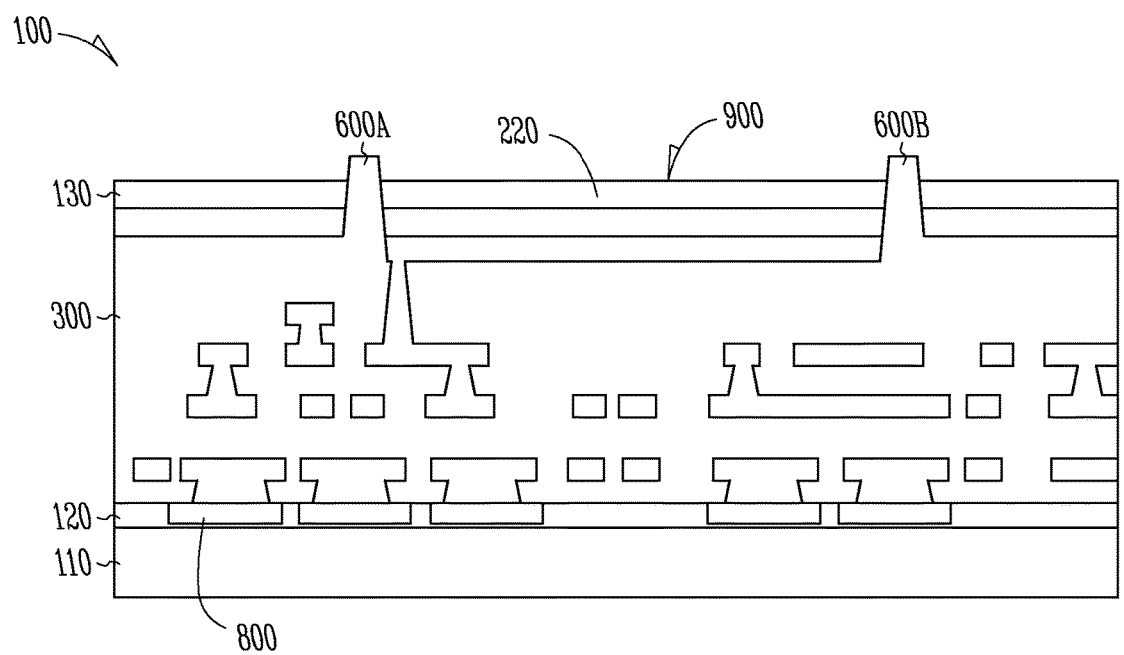
FIG. 9 shows the substrate of FIG. 1 during a manufacturing operation.

FIG. 9 shows the substrate 100 of FIG. 1 during a manufacturing operation. The substrate 100 may be decoupled (e.g., separated) from the carrier 110. The substrate 100 may be reoriented, and coupled with the carrier 110. For example, the first surface 810 (shown in FIG. 8) of the substrate 100 may be coupled to the carrier 110. The adhesive layer 120 may couple the substrate 100 to the carrier 110. The adhesive layer 120 may be located between the interconnects 800 and the carrier 110. As described herein, and as shown in FIG. 9, the filler regions 600A, 600B may extend beyond (e.g., project beyond, or the like) the first conductive layer 130. Accordingly, the dielectric material 300 of the filler regions 600A, 600B may extend beyond a conductor surface 900 of the first conductor 220.

Figure 10:
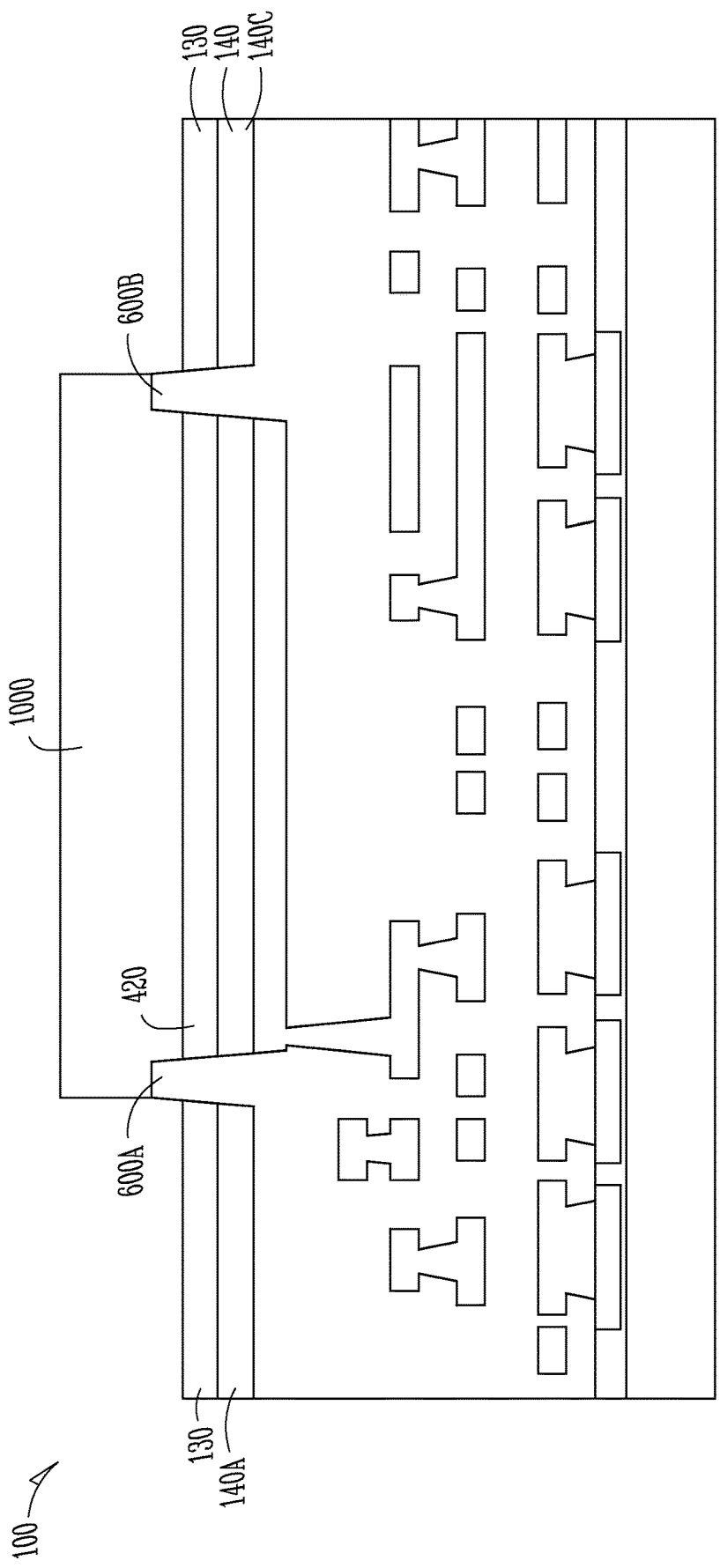
FIG. 10 shows the substrate of FIG. 1 during a manufacturing operation.

FIG. 10 shows the substrate 100 of FIG. 1 during a manufacturing operation. A film resist 1000 (e.g., a photoresist or the like) may be coupled to the substrate 100. For example, the resist 1000 may be coupled to the first conductor 420. The resist 1000 may be coupled to the filler regions 600A, 600B. The resist 1000 may protect the conductor 420 during removal of portions of the first conductive layer 130. For instance, portions of the conductive layer 130 may be removed (e.g., etched with a solvent, ablated, or the like) and the resist 1000 may inhibit the removal of conductor 420 during the removal operation. Portions of the conductive layer 130 that are coupled to the sections 140A, 140C of the capacitive material 140 may be removed. The first conductor 420 may be protected from the removal operation because the resist 1000 inhibits removal of the conductor 420.

Figure 11:
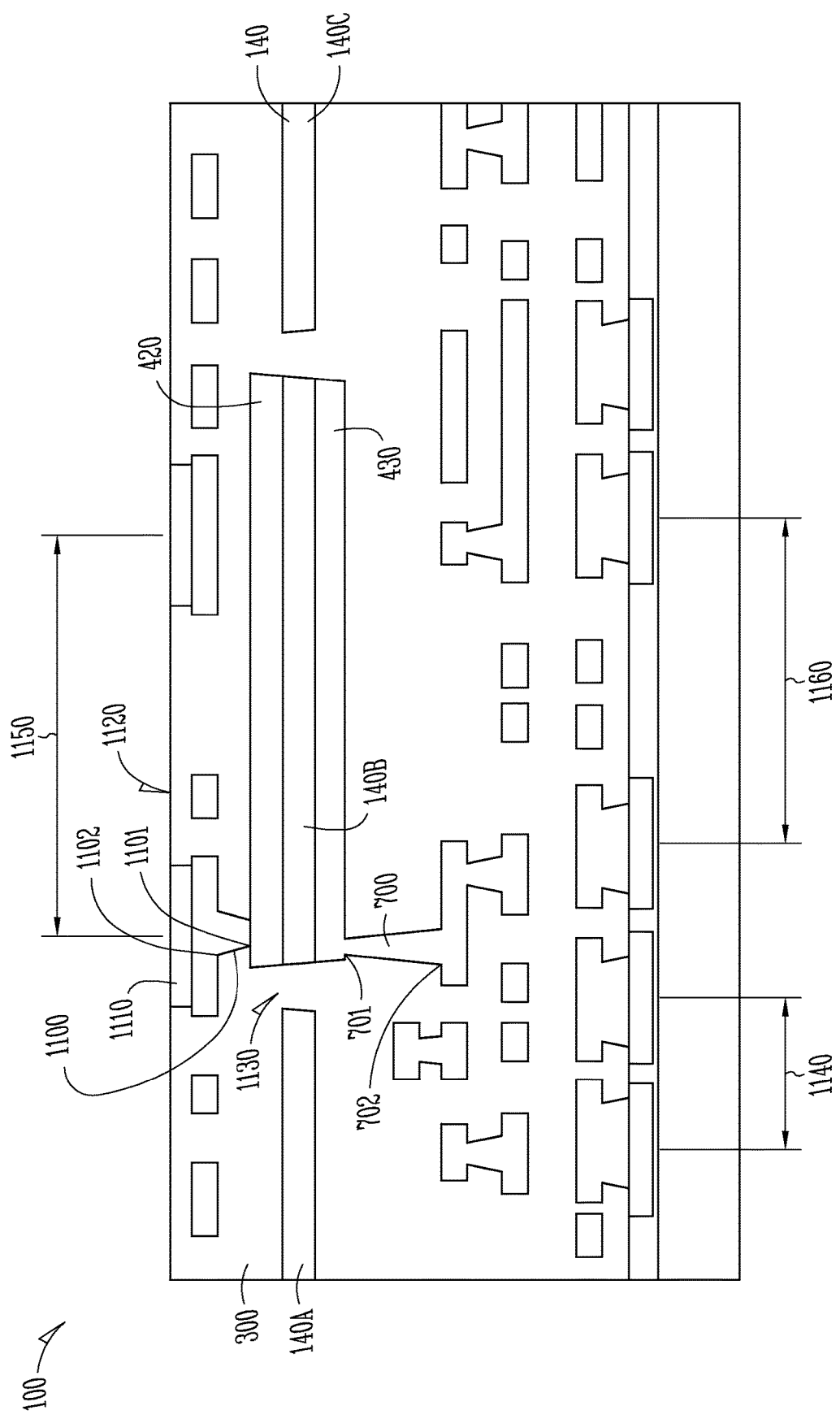
FIG. 11 shows the substrate of FIG. 1 during a manufacturing operation.

FIG. 11 shows the substrate 100 of FIG. 1 during a manufacturing operation. As shown in FIG. 11, portions of the conductive layer 130 may be removed from the substrate 100, and the dielectric material 300 may be coupled to the sections 140A, 140C of the capacitive material 140. The dielectric material 300 may enclose the conductor 420.

As described herein, the substrate 100 may include the first via 700. The first via 700 may include a tapered profile. For instance, the first via 700 may include a first via end 701 and a second via end 702. The end 702 may have a greater dimension than (e.g., may be wider than) the end 701. The substrate 100 may include a second via 1100. The second via 1100 may include a tapered profile. For instance, the via 1100 may include a first via end 1101 and a second via end 1102. The end 1102 may have a greater dimension than (e.g., may be wider than) the end 1101.

The tapered profile of the first via 700 may be inverted with respect to the tapered profile of the second via 1100. For example, the first end 701 of the via 700 may be coupled to the second conductor 430. The first end 1101 of the via 1100 may be coupled to the first conductor 420. In this example, because the ends 702, 1102 may have a greater dimension than the ends 701, 1101, the tapered profile of the via 700 may be inverted with respect to the tapered profile of the via 1100. The profiles may be inverted because the substrate 100 was reoriented (e.g., flipped, turned, or the like) during manufacturing.

As described herein, the substrate 100 may include the first set of interconnects 800. The substrate 100 may include a second set of interconnects 1110. The interconnects 800, 1110 may be located on opposite surfaces of the substrate 100. For example, the interconnects 800 may be located on the first surface 810 (shown in FIG. 8) of the substrate 100. The interconnects 1110 may be located on a second side 1120 of the substrate 100. The interconnects 1110 may be coupled with additional components. For instance, the interconnects 1110 may be coupled with a semiconductor die. The substrate 100 may route signals between the components. For instance, the substrate 100 may route signals between a semiconductor die and a motherboard.

The interconnects 800 may be spaced at a first pitch. The interconnects 1110 may be spaced at a second pitch. The first pitch may be different than (e.g., greater than) the second pitch. The interconnects 800, 1100 may have variable pitches. For example, the interconnects 800 may be spaced at the first pitch 1140. Additionally, a subset of the interconnects 800 may be spaced at a third pitch 1160. The third pitch 1160 may be greater than the first pitch 1140.

The substrate 100 may include a capacitor 1130. The capacitor 1130 may include the first conductor 420, the second conductor 430, and the second section 140B of capacitive material 140. The capacitor 1130 may store an electrical charge. For instance, an electrical signal (e.g., current) may be transmitted to the conductor 420 from the via 700. The second section 140B of the capacitive material 140 may store an electrical charge, for example due to a voltage differential between the conductors 420, 430. The capacitor 1130 may be discharged, and the electrical charge stored in the capacitor 1130 (e.g., charge built up on the first conductor 420) may be discharged. An electrical signal may be transmitted (e.g., current may flow) between the first conductor 420 and the second conductor 430 when the capacitor 1130 is discharged. The capacitor 1130 may help regulate power delivery to components connected to the substrate 100.

Figure 12:
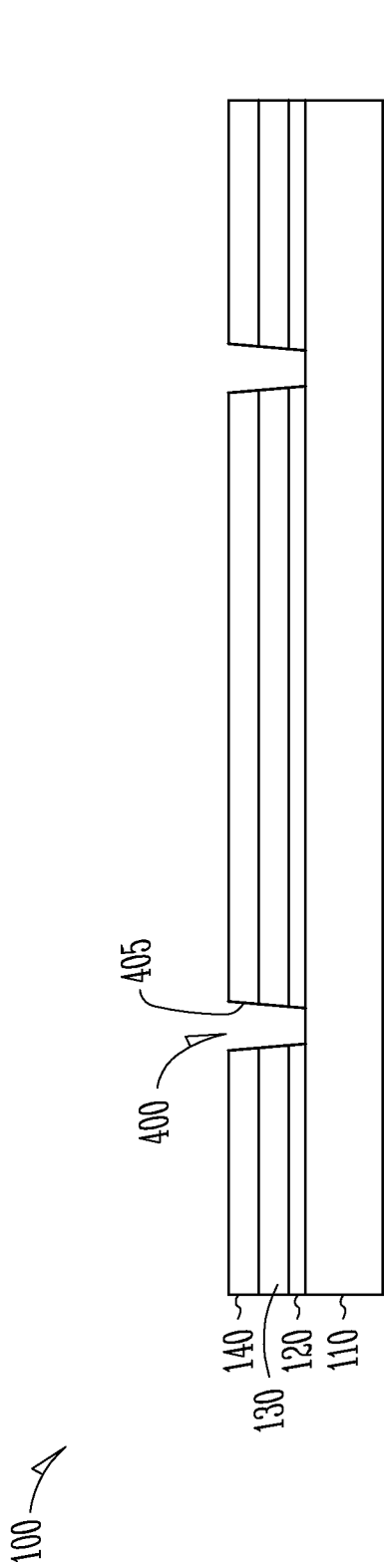
FIG. 12 shows the substrate of FIG. 1 during a manufacturing operation.

FIG. 12 shows the substrate 100 of FIG. 1 during a manufacturing operation. As described herein, the substrate 100 may include a cavity 400. The cavity 400 may extend through the capacitive material 140, the first conductive layer 130, and the adhesive 120. The cavity 400 may interface with (e.g., be in communication with) the carrier 110. The walls 405 of the cavity may be tapered.

Figure 13:
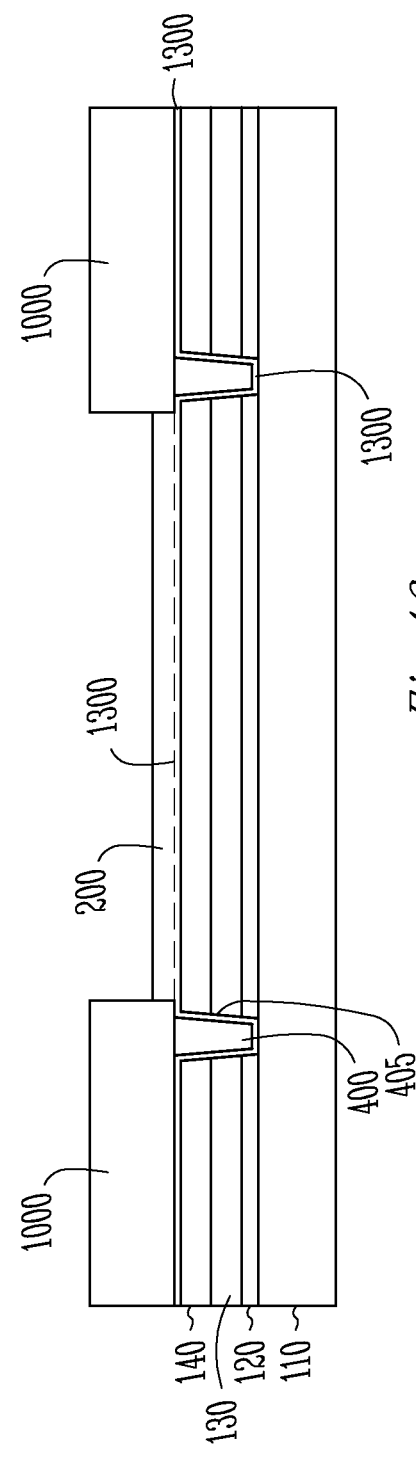
FIG. 13 shows the substrate of FIG. 1 during a manufacturing operation.

FIG. 13 shows the substrate 100 of FIG. 1 during a manufacturing operation. The substrate 100 may include a seed layer 1300 (e.g., copper, nickel, or the like), and the seed layer 1300 may be coupled to (e.g., sputtered, electroless plated, or the like) the substrate 100. For instance, the seed layer 1300 may be coupled to the capacitive layer 140, the first conductive layer 130, the adhesive layer 120, the walls 405 of the cavity 400, and may be coupled to the carrier 110 (e.g., a bottom of the cavity 400).

The film resist 1000 may be coupled to the substrate 100. For example, the resist 1000 may be coupled to the seed layer 1300. The resist 1000 may cover (e.g., shield, located over, seal, enclose, or the like) the seed layer 1300, for instance portions of the seed layer 1300 located in the cavity 400 (e.g., portions of the seed layer 1300 coupled to the walls 405 of the cavity 400).

The second conductive layer 200 (e.g., copper, nickel, or the like) may be coupled the seed layer 1300. For example the second conductive layer 200 may be coupled to portions of the seed layer 1300 that are not covered by the resist 1000. The conductive layer 200 may be plated (e.g., with an electrolytic operation) to the seed layer 1300.

Figure 14:
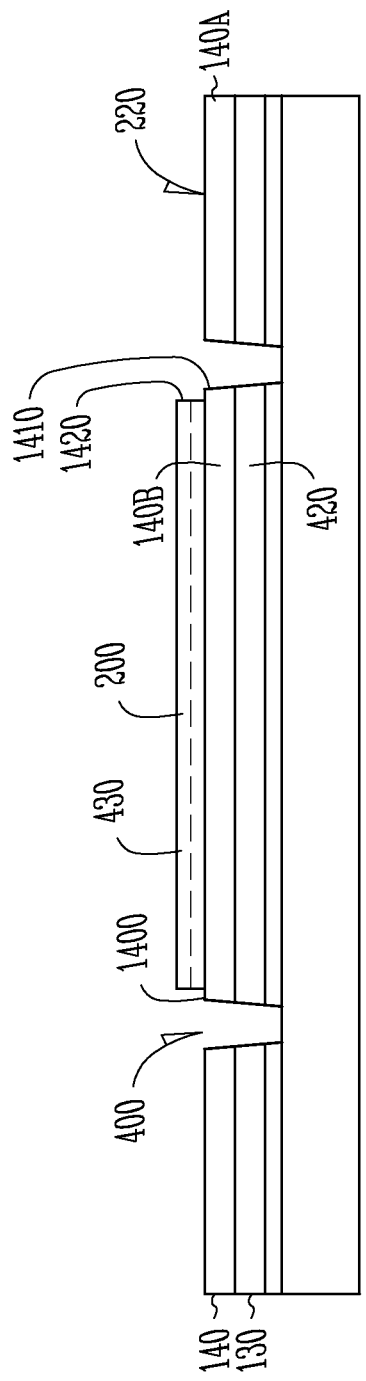
FIG. 14 shows the substrate of FIG. 1 during a manufacturing operation.

FIG. 14 shows the substrate 100 of FIG. 1 during a manufacturing operation. The resist 1000 (shown in FIG. 13) may be decoupled (e.g., developed, removed, stripped, or the like) from the substrate 100 (e.g., the seed layer 1300). Portions of the seed layer 1300 (and the second conductive layer 200) may be removed from the substrate, for instance by an etching operation. Accordingly, the seed layer 1600 may be removed from the cavity 400 (and the walls 405 of the cavity 400, shown in FIG. 13) and portions of the capacitive material 140 (e.g., the first section 140A of the capacitive material 140).

The removal of the seed layer 1300 may not affect the first conductive layer 130, the capacitive material 140, or the first conductor 420. For example, the seed layer 130 and the second conductive layer 200 may include copper. The first conductive layer 200 and the first conductor 400 may include nickel. The capacitive material 140 may include a polymeric material. An etching operation utilizing an etching solution may react with the copper, and the etching solution may etch away the copper. The etching solution may not react with the nickel, and accordingly the etching solution may not etch the nickel. The etching solution may not react with the capacitive material 140.

The coupling of the second conductive layer 200 to the seed layer 1300 may provide the second conductor 430. As described herein, the first conductor 420 and the second conductor 430 may be coupled to the second section 140B of the capacitive material 140. For instance, the first conductor 420 may be directly coupled (e.g., coupled with surface-to-surface contact) to the first surface 210 (shown in FIG. 2) of the capacitive material 140. The second conductor 430 may be directly coupled to the second surface 220 (shown in FIG. 2) of the capacitive material 140.

The substrate 100 may include a notch 1400. For instance, a wall 1410 of the capacitive material 140 may not be aligned with a wall 1420 of the second conductor 430. Accordingly, the substrate 100 may include the notch 1400 because the wall 1420 may be recessed from wall 1410. The wall 1410 of the capacitive material 140 may not be perpendicular to the second surface 220 of the capacitive material (e.g., angled with respect to the surface 220 of the capacitive material 140). The wall 1420 of the second conductor 420 may be perpendicular to the second surface 220 of the capacitive material 140. The formation of the cavity 400 may cause the wall 1410 to not be perpendicular to the surface 220 (e.g., a laser ablation operation provides the tapered profile to the cavity 400). The resist 1000 (shown in FIG. 13) may be patterned to have a rectangular profile and the resist 1000 may cover the cavity 400. Accordingly, the wall 1420 may be perpendicular to the surface 220.

Figure 15:
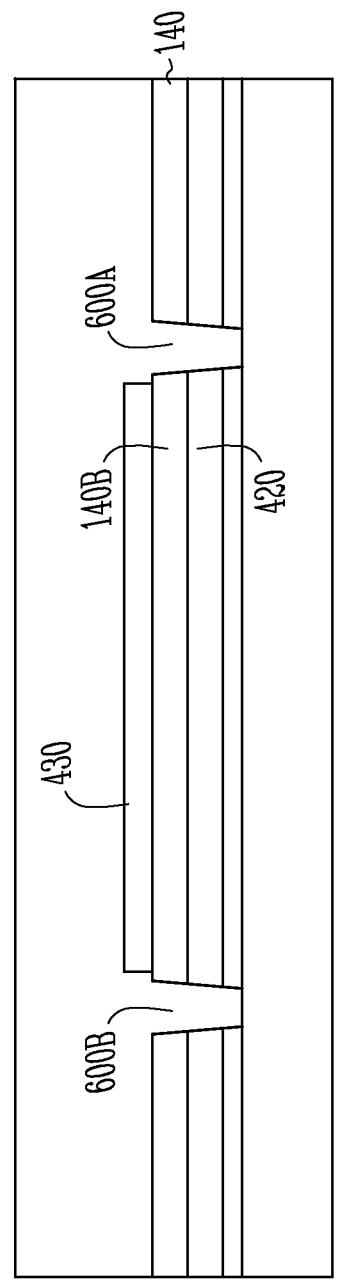
FIG. 15 shows the substrate of FIG. 1 during a manufacturing operation.

FIG. 15 shows the substrate 100 of FIG. 1 during a manufacturing operation. As described herein, the dielectric material 300 may be coupled to the substrate 100. The substrate 100 may include the filler regions 600A, 600B. For instance, the dielectric material 300 may be located in (e.g., fill) the cavity 400 (shown in FIG. 14) and the dielectric material 300 may be coupled to the conductors 420, 430 and the second section 140B of the capacitive material 140.

Figure 16:
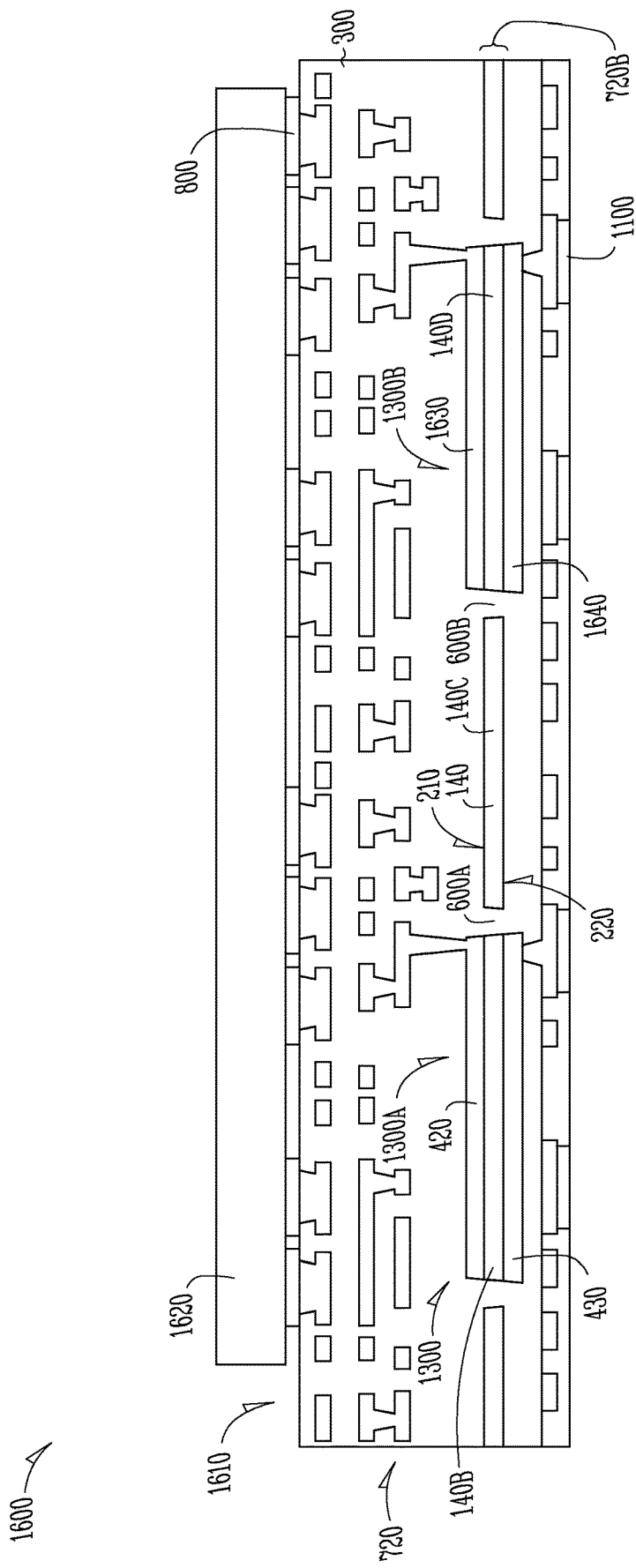
FIG. 16 shows a portion of a package including a second substrate and a die.

FIG. 16 shows a portion of a package 1600 including a second substrate 1610 and a die 1620. The second substrate 1610 may be similar to the substrate 100. The die 1620 may include a semiconductor die, and the die 1620 may be configured to perform one or more functions (e.g., process data, store data, or the like). The die 1620 may be coupled to the interconnects 800 (or the interconnects 1100) of the substrate 1610.

The substrate 1620 may include one or more capacitors 1300, for example a first capacitor 1300A and a second capacitor 1300B. The die 1620 may be in electrical communication with the capacitors 1300 (e.g., through the via 700, shown in FIG. 7) The capacitor 1300A may include the first conductor 420 directly coupled to the first surface 210 of the second section 140B of the capacitive material 140. The second conductor 430 may be directly coupled to the second surface 220 of the second section 140B of the capacitive material 140. The capacitor 1300B may include a third conductor 1630 directly coupled to the first surface 210 of a fourth section 140D of the capacitive material 140. A fourth conductor 1640 may be directly coupled to the second surface 220 of the fourth section 140D of the capacitive material 140.

The third section 140C of the capacitive material 140 may be located between the second section 140B and the fourth section 140D. The filler region 600A may be located between the sections 140B, 140C. The filler region 600B may be located between the sections 140C, 140D. FIG. 16 shows that the section 140C may not be coupled to the conductors 420, 430, 1630, 1640. The dielectric material 300 may enclose the third section 140C of the capacitive material 140. The capacitive material 140 may be dielectric, and in some examples, the third section 140C may be included in the substrate 140 even though the third section 140C may not be connected to a conductor (e.g., the conductor 420).

The capacitors 1300A, 1300B may be located in the same layers 720 of the substrate 1610, however the present subject matter is not so limited. For example, the sections 140B, 140C, 140D of the capacitive material 140 may be located in the layer 720B of the substrate 1610. As described in greater detail herein, the capacitors 1300A, 1300B may be located in different layers 720 of the substrate 1610. The capacitors 1300A, 1300B may share layers 720 of the substrate 1610.

Figure 17:
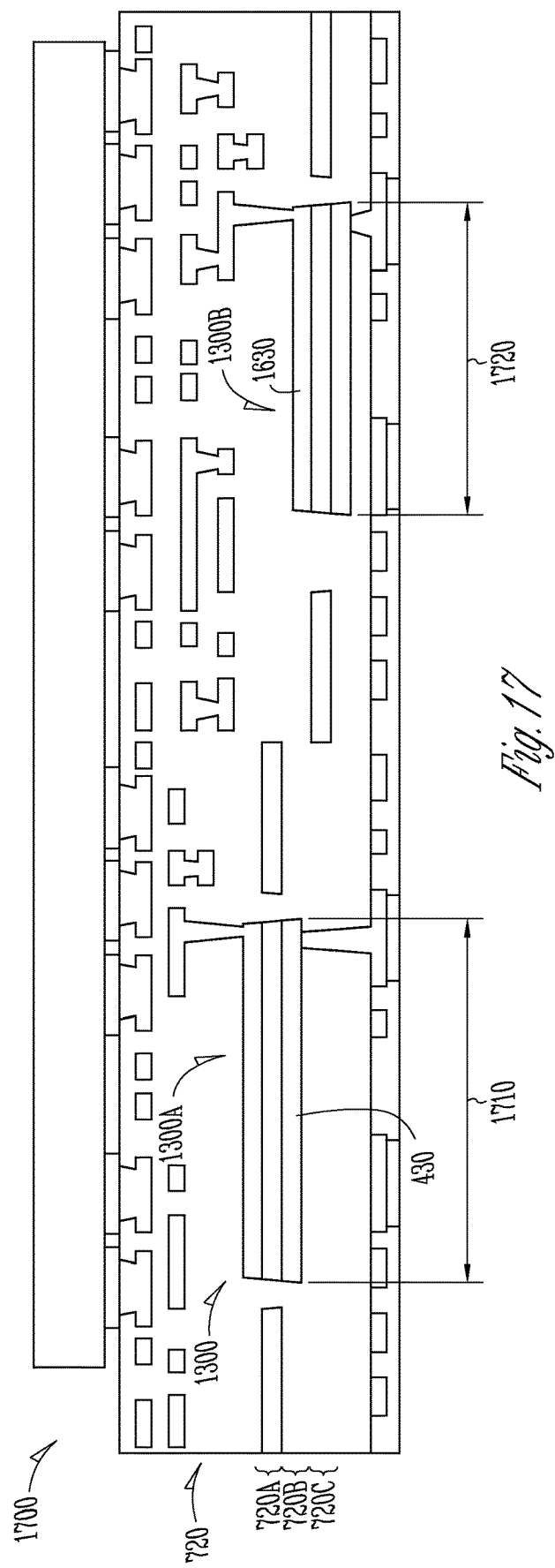
FIG. 17 shows a portion of a third substrate.

FIG. 17 shows a portion of a third substrate 1700. As described in herein, the capacitors 1300A, 1300B may be located in different layers 720 of the substrate 1700. For example, the section 140B of the capacitive material 140 may be located in the layer 720A of the substrate 1700. The section 140D of the capacitive material 140 may be located in the layer 720C of the substrate 1700. Accordingly, the capacitors 1300A, 1300B may be offset (e.g., vertically) with respect to each other. The capacitor 1300A may be located in the first layer 720A, while in some examples the capacitor 1300B may not be located in the first layer 720A.

The capacitors 1300A, 1300B may share layers 720 of the substrate 1610. For example, the second conductor 430 may be located in the layer 720C. The third conductor 1630 may be located in the layer 720C. The capacitors 1600A, 1600B may share portions of the layer 720C.

The capacitor 1300A may have a first dimension 1710 (e.g., a width, area, volume or the like). For example, a width of the second conductor 430 may correspond to the first dimension 1710. The capacitor 1300B may have a second dimension 1720. The dimensions 1710, 1720 of the capacitors 1300A, 1300B may be equal, or the dimensions 1710, 1720 of the capacitors 1300A, 1300B may be different. Varying the dimensions 1710, 1720 of the capacitors 1300A, 1300B may change the capacitance of the capacitors 1300A, 1300B. For instance, the first capacitor 1300A may have a first capacitance, and the second capacitor may have a second capacitance. The change in total capacitance (for instance measured in Farads) of the capacitors 1300 may correspond to the change in dimensions 1710, 1720 of the capacitors 1300A, 1300B.

Figure 18:
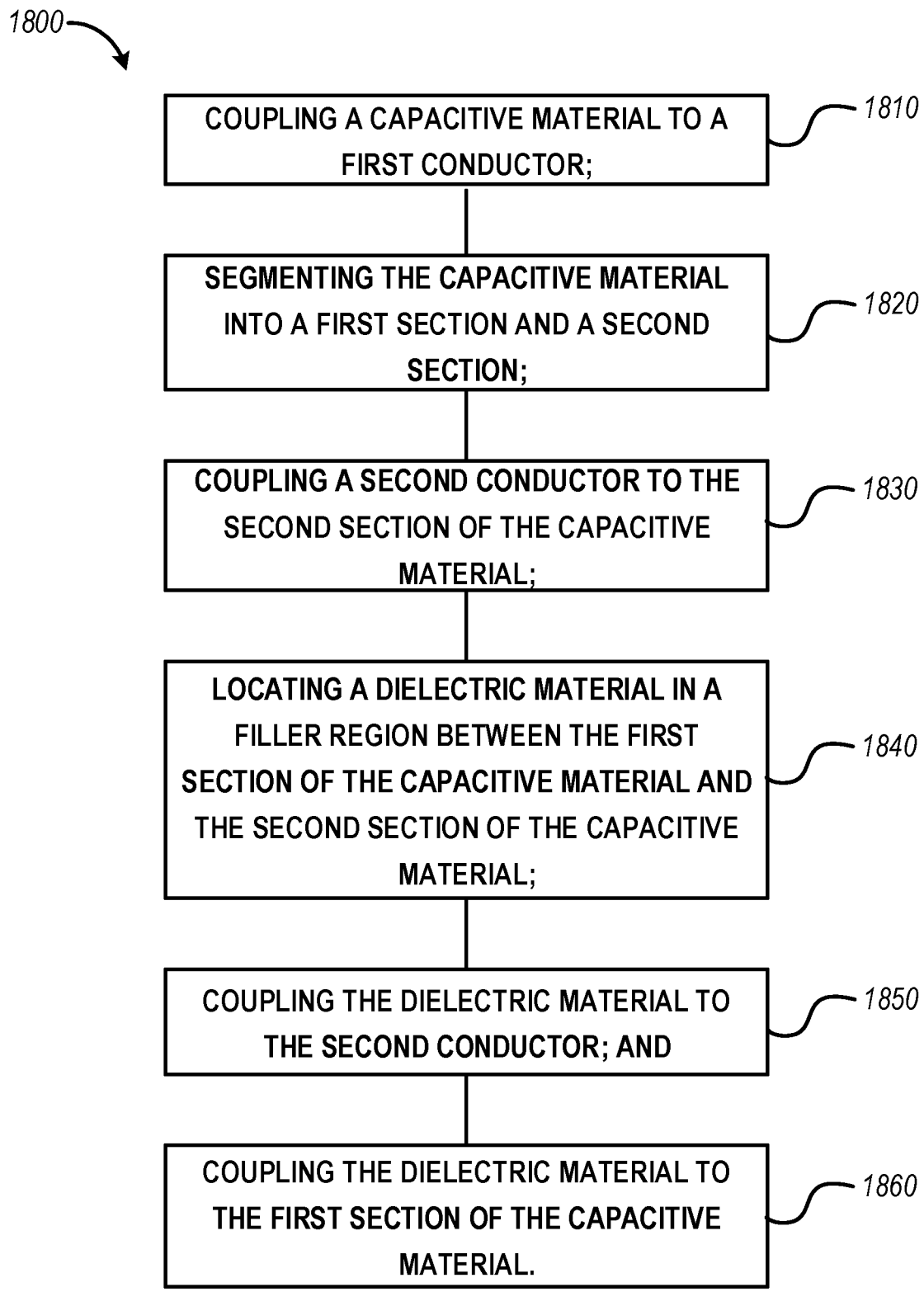
FIG. 18 shows one example of a method for manufacturing an electronic device.

FIG. 18 shows one example of a method 1800 for manufacturing an electronic device, including one or more of the substrate 100, the package 1600, the substrate 1610, or the substrate 1700 described herein. In describing the method 1800, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described in the method 1800 include, but are not limited to, the corresponding numbered elements provided herein and other corresponding elements described herein (both numbered and unnumbered) as well as their equivalents.

At 1810, a capacitive material 140 may be coupled to a first conductor 420.

The method 1800 may include at 1820 that the capacitive material may be segmented into a first section 140A and a second section 140B. For example, a portion of the dielectric material 300 may be removed. A portion of the second conductor 430 may be removed. A portion of the capacitive material 140 may be removed. A portion of the first conductor 420 may be removed.

At 1830, a second conductor 420 may be coupled to the second section 140B of the capacitive material 140. At 1840, a dielectric material may be located in a filler region 600A between the first section 140A of the capacitive material 140 and the second section 140B of the capacitive material 140. The method 1800 may include at 1850 coupling a dielectric material 300 to the second conductor 430. At 1860, the dielectric material 300 may be coupled to the first section 140A of the capacitive material 140.

Several options for the method 18000 follow. A portion of the dielectric material may be removed to provide a first cavity 400. A first conductive via 700 may be located in the first cavity 400, The first conductive via 700 may be coupled to the second conductor 430. The via 700 may have a first tapered profile including a first end 701 and a second end 702. The second end 701 may have a greater dimension than the first end 702.

The dielectric material 300 may be removed (e.g. ablated, removed, or the like) to provide a second cavity 400. A second conductive via 1100 may be located in the second cavity 400. The via 1100 may have a second tapered profile including a third via end 1101 and a fourth via end 1102. The fourth via end 1102 may have a greater dimension than the third via end 1101. The first via end 701 may be coupled with the first conductor 420, and the third via end 1101 may be coupled with the second conductor 430.

Figure 19:
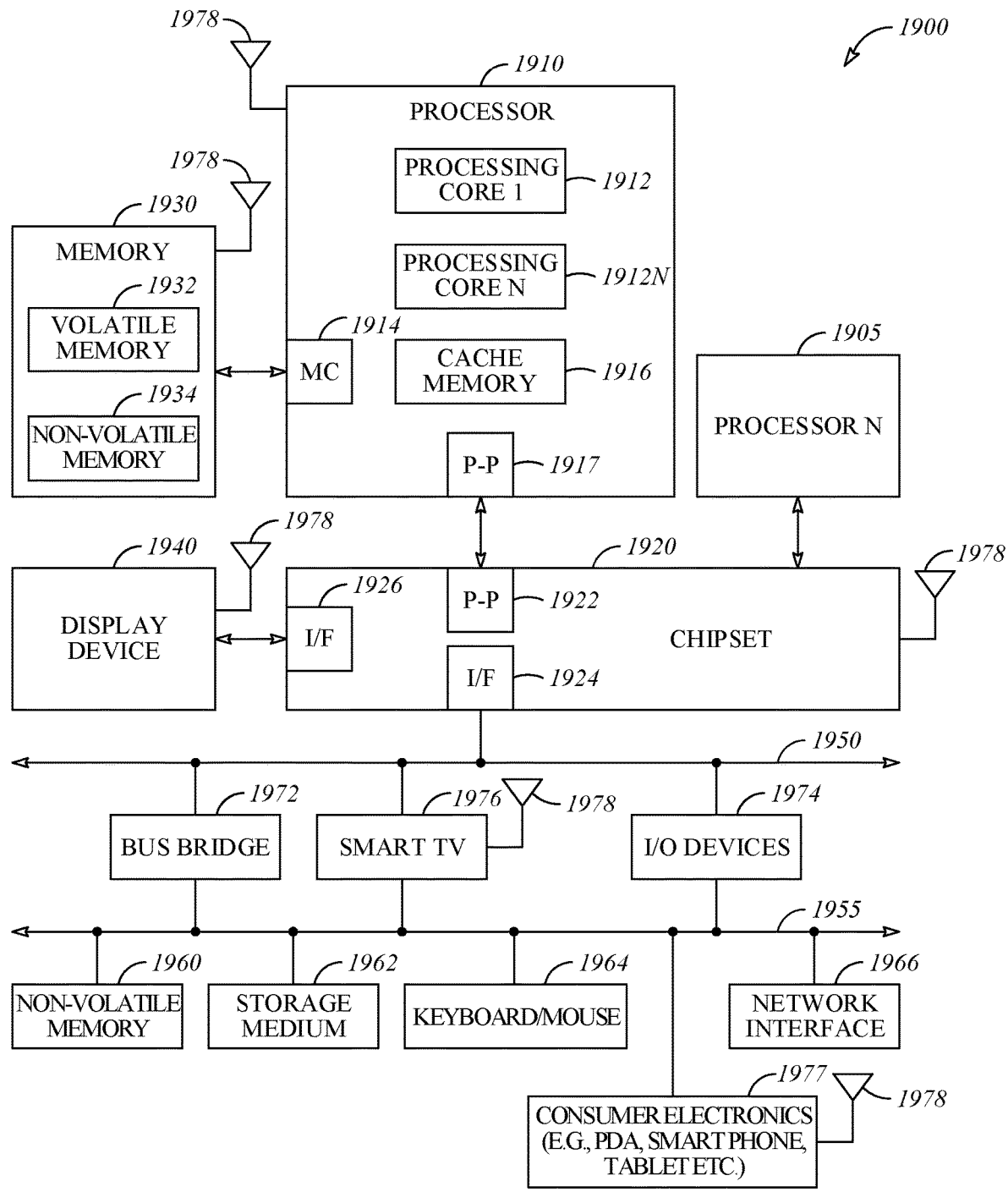
FIG. 19 illustrates a system level diagram, depicting an example of an electronic device.

FIG. 19 illustrates a system level diagram, depicting an example of an electronic device (e.g., system) including the package 100, the package 1600, or the package 1700 as described in the present disclosure. FIG. 19 is included to show an example of a higher level device application for the package 100, the package 1600, or the package 1700. In one embodiment, system 1900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1900 is a system on a chip (SOC) system.

In one embodiment, processor 1910 has one or more processor cores 1912 and 1912N, where 1912N represents the Nth processor core inside processor 1910 where N is a positive integer. In one embodiment, system 1900 includes multiple processors including 1910 and 1905, where processor 1905 has logic similar or identical to the logic of processor 1910. In some embodiments, processing core 1912 includes, but is not limited to, pre-fetch logic to fetch instructions, decode logic to decode the instructions, execution logic to execute instructions and the like. In some embodiments, processor 1910 has a cache memory 1916 to cache instructions and/or data for system 1900. Cache memory 1916 may be organized into a hierarchal structure including one or more levels of cache memory.

In some embodiments, processor 1910 includes a memory controller 1914, which is operable to perform functions that enable the processor 1910 to access and communicate with memory 1930 that includes a volatile memory 1932 and/or a non-volatile memory 1934. In some embodiments, processor 1910 is coupled with memory 1930 and chipset 1920. Processor 1910 may also be coupled to a wireless antenna 1978 to communicate with any device configured to transmit and/or receive wireless signals. In one embodiment, an interface for wireless antenna 1978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1934 includes, but is not limited to, flash memory, phase change memory (PCM), read-only memory (ROM), electrically erasable programmable read-only memory (EEPROM), or any other type of non-volatile memory device.

Memory 1930 stores information and instructions to be executed by processor 1910. In one embodiment, memory 1930 may also store temporary variables or other intermediate information while processor 1910 is executing instructions. In the illustrated embodiment, chipset 1920 connects with processor 1910 via Point-to-Point (PtP or P-P) interfaces 1917 and 1922. Chipset 1920 enables processor 1910 to connect to other elements in system 1900. In some embodiments of the example system, interfaces 1917 and 1922 operate in accordance with a PtP communication protocol such as the Intel® QuickPath Interconnect (QPI) or the like. In other embodiments, a different interconnect may be used.

In some embodiments, chipset 1920 is operable to communicate with processor 1910, 1905N, display device 1940, and other devices, including a bus bridge 1972, a smart TV 1976, I/O devices 1974, nonvolatile memory 1960, a storage medium (such as one or more mass storage devices) 1962, a keyboard/mouse 1964, a network interface 1966, and various forms of consumer electronics 1977 (such as a PDA, smart phone, tablet etc.), etc. In one embodiment, chipset 1920 couples with these devices through an interface 1924. Chipset 1920 may also be coupled to a wireless antenna 1978 to communicate with any device configured to transmit and/or receive wireless signals.

Chipset 1920 connects to display device 1940 via interface 1926. Display 1940 may be, for example, a liquid crystal display (LCD), a plasma display, cathode ray tube (CRT) display, or any other form of visual display device. In some embodiments of the example system, processor 1910 and chipset 1920 are merged into a single SOC. In addition, chipset 1920 connects to one or more buses 1950 and 1955 that interconnect various system elements, such as I/O devices 1974, nonvolatile memory 1960, storage medium 1962, a keyboard/mouse 1964, and network interface 1966. Buses 1950 and 1955 may be interconnected together via a bus bridge 1972.

In one embodiment, mass storage device 1962 includes, but is not limited to, a solid state drive, a hard disk drive, a universal serial bus flash memory drive, or any other form of computer data storage medium. In one embodiment, network interface 1966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 19 are depicted as separate blocks within the system 1900, the functions performed by some of these blocks may be integrated within a single semiconductor circuit or may be implemented using two or more separate integrated circuits. For example, although cache memory 1916 is depicted as a separate block within processor 1910, cache memory 1916 (or selected aspects of 1916) can be incorporated into processor core 1912.

VARIOUS NOTES & ASPECTS

Aspect 1 may include or use subject matter (such as an apparatus, a system, a device, a method, a means for performing acts, or a device readable medium including instructions that, when performed by the device, may cause the device to perform acts), such as may include or use a substrate for an electronic device, comprising: a first layer including a capacitive material segmented into a first section, and a second section, wherein each of the first section and the second section includes a first surface and a second surface; a second layer including a first conductor; a third layer including a second conductor; wherein the first surface of the second section of the capacitive material is directly coupled to the first conductor and the second surface of the second section of the capacitive material is directly coupled to the second conductor; and a first filler region including a dielectric material and located between the first section of the capacitive material and the second section of the capacitive material.

Aspect 2 may include or use, or may optionally be combined with the subject matter of Aspect 1, to optionally include or use wherein the capacitive material is segmented into a third section, and further comprising a second filler region including the dielectric material and located between the second section of capacitive material and the third section of capacitive material.

Aspect 3 may include or use, or may optionally be combined with the subject matter of one or any combination of Aspects 1 or 2 to optionally include or use wherein the first conductor includes a first metal material and the second conductor includes a second metal material.

Aspect 4 may include or use, or may optionally be combined with the subject matter of one or any combination of Aspects 1 through 3 to optionally include or use wherein the first filler region has a tapered profile.

Aspect 5 may include or use, or may optionally be combined with the subject matter of one or any combination of Aspects 1 through 4 to optionally include or use a first via coupled with the first conductor, wherein the first via has a first tapered profile including a first via end and a second via end, and the second via end has a greater dimension than the first via end; a second via coupled with the second conductor, wherein the second via has a second tapered profile including a third via end and a fourth via end, and the fourth via end has a greater dimension than the third via end; and wherein the first via end is coupled with the first conductor and the third via end is coupled with the second conductor.

Aspect 6 may include or use, or may optionally be combined with the subject matter of one or any combination of Aspects 1 through 5 to optionally include or use wherein the first filler region is coupled with the first conductor, the second conductor, and the capacitive material.

Aspect 7 may include or use, or may optionally be combined with the subject matter of one or any combination of Aspects 1 through 6 to optionally include or use wherein the first filler region includes a protrusion extending beyond the second conductor.

Aspect 8 may include or use, or may optionally be combined with the subject matter of one or any combination of Aspects 1 through 7 to optionally include or use wherein the first conductor, the second conductor, and the capacitive material include a tapered profile.

Aspect 9 may include or use, or may optionally be combined with the subject matter of one or any combination of Aspects 1 through 8 to optionally include or use wherein the first conductor includes a first metal material and the second conductor includes a second metal material.

Aspect 10 may include or use, or may optionally be combined with the subject matter of one or any combination of Aspects 1 through 9 to optionally include or use wherein the capacitive material has a relative permittivity within a range of approximately 250 to 90,000.

Aspect 11 may include or use, or may optionally be combined with the subject matter of one or any combination of Aspects 1 through 10 to optionally include or use wherein the first section of the capacitive material is enclosed in the dielectric material.

Aspect 12 may include or use, or may optionally be combined with the subject matter of one or any combination of Aspects 1 through 11 to optionally include or use wherein the first section of the capacitive material is not coupled with a conductor.

Aspect 13 may include or use subject matter (such as an apparatus, a system, a device, a method, a means for performing acts, or a device readable medium including instructions that, when performed by the device, may cause the device to perform acts), such as may include or use an electronic device, comprising: a substrate including: a first layer including a capacitive material segmented into a first section, and a second section, wherein each of the first section and the second section includes a first surface and a second surface; a second layer including a first conductor; a third layer including a second conductor; wherein the first surface of the second section of capacitive material is directly coupled to the first conductor and the second surface of the second section of capacitive material is directly coupled to the second conductor; and a first filler region including a dielectric material and located between the first section of capacitive material and the second section of capacitive material; and a semiconductor die coupled to the substrate.

Aspect 14 may include or use, or may optionally be combined with the subject matter of Aspect 13, to optionally include or use wherein the capacitive material is a first capacitive material, and further comprising: a fourth layer including a second capacitive material segmented into a first section and a second section; a third conductor directly coupled with a first surface of the second section of the second capacitive material; a fourth conductor directly coupled with a second surface of the second section of the second capacitive material; and a second filler region including the dielectric material and located between the first section of the second capacitive material and the second section of the second capacitive material.

Aspect 15 may include or use, or may optionally be combined with the subject matter of Aspect 14 to optionally include or use wherein the second section of the first capacitive material has a first dimension, and the second section of the second capacitive material has a second dimension.

Aspect 16 may include or use, or may optionally be combined with the subject matter of one or any combination of Aspects 13 through 15 to optionally include or use a third conductor directly coupled with the first surface of the first section of the capacitive material; and a fourth conductor directly coupled with a second surface of the first section of the capacitive material.

Aspect 17 may include or use, or may optionally be combined with the subject matter of one or any combination of Aspects 13 through 16 to optionally include or use wherein the capacitive material is segmented into a third section having a first surface and a second surface, and further comprising: a third conductor directly coupled with the first surface of the third section of the capacitive material; and a fourth conductor directly coupled with the second surface of the third section of the capacitive material.

Aspect 18 may include or use, or may optionally be combined with the subject matter of Aspect 17 to optionally include or use a second filler region including the dielectric material and located between the second section of the capacitive material and the third section of capacitive material.

Aspect 19 may include or use, or may optionally be combined with the subject matter of Aspect 18 to optionally include or use wherein the second section of the capacitive material is located between the first section of the capacitive material and the third section of the capacitive material.

Aspect 20 may include or use, or may optionally be combined with the subject matter of one or any combination of Aspects 13 through 19 to optionally include or use wherein the die is in electrical communication with the first conductor or the second conductor.

Aspect 21 may include or use subject matter (such as an apparatus, a system, a device, a method, a means for performing acts, or a device readable medium including instructions that, when performed by the device, may cause the device to perform acts), such as may include or use a method for manufacturing an electronic device, comprising: coupling a capacitive material to a first conductor; segmenting the capacitive material into a first section and a second section; coupling a second conductor to the second section of the capacitive material; locating a dielectric material in a filler region between the first section of the capacitive material and the second section of the capacitive material; coupling the dielectric material to the second conductor; and coupling the dielectric material to the first section of the capacitive material.

Aspect 22 may include or use, or may optionally be combined with the subject matter of Aspect 21, to optionally include or use removing a portion of the dielectric material to provide a first cavity; and locating a first conductive via in the first cavity, wherein the first conductive via is coupled to the second conductor.

Aspect 23 may include or use, or may optionally be combined with the subject matter of Aspect 22 to optionally include or use wherein the first conductive via has a first tapered profile including a first end and a second end, and the second end has a greater dimension than the first end and further comprising: removing the dielectric material to provide a second cavity; and locating a second conductive via in the second cavity, wherein the second conductive via has a second tapered profile including a third via end and a fourth via end, and the fourth via end has a greater dimension than the third via end; and wherein the first via end is coupled with the first conductor and the third via end is coupled with the second conductor.

Aspect 24 may include or use, or may optionally be combined with the subject matter of one or any combination of Aspects 21 through 23 to optionally include or use wherein segmenting the capacitive material includes: removing a portion of the dielectric material; removing a portion of the second conductor; and removing a portion of the capacitive material.

Aspect 25 may include or use, or may optionally be combined with the subject matter of one or any combination of Aspects 21 through 24 to optionally include or use removing a portion of the first conductor.

Aspect 26 may include or use, or may optionally be combined with any portion or combination of any portions of any one or more of Aspects 1 through 25 to include or use, subject matter that may include means for performing any one or more of the functions of Aspects 1 through 25, or a machine-readable medium including instructions that, when performed by a machine, cause the machine to perform any one or more of the functions of Aspects 1 through 25.

Each of these non-limiting aspects may stand on its own, or may be combined in various permutations or combinations with one or more of the other aspects.

The above description includes references to the accompanying drawings, which form a part of the detailed description. The drawings show, by way of illustration, specific embodiments in which the invention may be practiced.

These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A substrate for an electronic device, comprising:
   a first layer including a capacitive material segmented into a first section, and a second section, wherein each of the first section and the second section includes a first surface and a second surface;
   a second layer including a first conductor;
   a third layer including a second conductor;
   wherein the first surface of the second section of the capacitive material is directly coupled to the first conductor and the second surface of the second section of the capacitive material is directly coupled to the second conductor; and
   a first filler region including a dielectric material and located between the first section of the capacitive material and the second section of the capacitive material wherein the first filler region is coupled with the first conductor, the second conductor, and the capacitive material.

2. The substrate of claim 1, wherein the capacitive material is segmented into a third section, and further comprising a second filler region including the dielectric material and located between the second section of capacitive material and the third section of capacitive material.

3. The substrate of claim 1, wherein the first conductor includes a first metal material and the second conductor includes a second metal material.

4. The substrate of claim 1, wherein the first filler region has a tapered filler region profile.

5. The substrate of claim 1, further comprising:
   a first via coupled with the first conductor, wherein the first via has a first tapered via profile including a first via end and a second via end, and the second via end has a greater dimension than the first via end;
   a second via coupled with the second conductor, wherein the second via has a second tapered via profile including a third via end and a fourth via end, and the fourth via end has a greater dimension than the third via end; and
   wherein the first via end is coupled with the first conductor and the third via end is coupled with the second conductor.

6. The substrate of claim 1, wherein the first filler region includes a protrusion extending beyond the second conductor.

7. The substrate of claim 1, wherein the first conductor, the second conductor, and the capacitive material include a tapered profile.

8. The substrate of claim 1, wherein the capacitive material has a relative permittivity within a range of approximately 250 to 90,000.

9. The substrate of claim 1, wherein the first section of the capacitive material is enclosed in the dielectric material.

10. The substrate of claim 1, wherein the first section of the capacitive material is not coupled with a conductor.

11. An electronic device, comprising:
a substrate including:
a first layer including a capacitive material segmented into a first section, and a second section, wherein each of the first section and the second section includes a first surface and a second surface;
a second layer including a first conductor;
a third layer including a second conductor;
wherein the first surface of the second section of capacitive material is directly coupled to the first conductor and the second surface of the second section of capacitive material is directly coupled to the second conductor; and
a first filler region including a dielectric material and located between the first section of capacitive material and the second section of capacitive material, wherein the first filler region has a tapered filler region profile; and
a semiconductor die coupled to the substrate.

12. The electronic device of claim 11, wherein the capacitive material is a first capacitive material, and further comprising:
a fourth layer including a second capacitive material segmented into a first section and a second section;
a third conductor directly coupled with a first surface of the second section of the second capacitive material;
a fourth conductor directly coupled with a second surface of the second section of the second capacitive material; and
a second filler region including the dielectric material and located between the first section of the second capacitive material and the second section of the second capacitive material.

13. The electronic device of claim 12, wherein the second section of the first capacitive material has a first dimension, and the second section of the second capacitive material has a second dimension.

14. The electronic device of claim 11, further comprising:
a third conductor directly coupled with the first surface of the first section of the capacitive material; and
a fourth conductor directly coupled with a second surface of the first section of the capacitive material.

15. The electronic device of claim 11, wherein the capacitive material is segmented into a third section having a first surface and a second surface, and further comprising:
a third conductor directly coupled with the first surface of the third section of the capacitive material; and
a fourth conductor directly coupled with the second surface of the third section of the capacitive material.

16. The electronic device of claim 15, further comprising a second filler region including the dielectric material and located between the second section of the capacitive material and the third section of capacitive material.

17. The electronic device of claim 16, wherein the second section of the capacitive material is located between the first section of the capacitive material and the third section of the capacitive material.

18. The electronic device of claim 11, wherein the die is in electrical communication with the first conductor or the second conductor.

19. The electronic device of claim 11, further comprising:
a first via coupled with the first conductor, wherein the first via has a first tapered via profile including a first via end and a second via end, and the second via end has a greater dimension than the first via end;
a second via coupled with the second conductor, wherein the second via has a second tapered via profile including a third via end and a fourth via end, and the fourth via end has a greater dimension than the third via end; and
wherein the first via end is coupled with the first conductor and the third via end is coupled with the second conductor.

20. The electronic device of claim 11, wherein the first filler region is coupled with the first conductor, the second conductor, and the capacitive material.

21. The substrate of claim 11, wherein the first conductor, the second conductor, and the capacitive material include a tapered profile.

22. A substrate for an electronic device, comprising:
a first layer including a capacitive material segmented into a first section, and a second section, wherein each of the first section and the second section includes a first surface and a second surface;
a second layer including a first conductor;
a third layer including a second conductor;
wherein the first surface of the second section of the capacitive material is directly coupled to the first conductor and the second surface of the second section of the capacitive material is directly coupled to the second conductor; and
a first filler region including a dielectric material and located between the first section of the capacitive material and the second section of the capacitive material, wherein the first filler region has a tapered filler region profile.

23. The substrate of claim 22, wherein the first filler region is coupled with the first conductor, the second conductor, and the capacitive material.

24. The substrate of claim 22, wherein the first conductor, the second conductor, and the capacitive material include a tapered profile.

25. The substrate of claim 22, further comprising:
a first via coupled with the first conductor, wherein the first via has a first tapered via profile including a first via end and a second via end, and the second via end has a greater dimension than the first via end;
a second via coupled with the second conductor, wherein the second via has a second tapered via profile including a third via end and a fourth via end, and the fourth via end has a greater dimension than the third via end; and
wherein the first via end is coupled with the first conductor and the third via end is coupled with the second conductor.

* * * * *